United States Patent
Lee et al.

(10) Patent No.: US 11,626,186 B2
(45) Date of Patent: Apr. 11, 2023

(54) APPARATUS PERFORMING REPAIR OPERATION

(71) Applicant: SK hynix Inc., Icheon-si (KR)

(72) Inventors: Dong Beom Lee, Icheon-si (KR); Hyeong Soo Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 110 days.

(21) Appl. No.: 17/246,126

(22) Filed: Apr. 30, 2021

(65) Prior Publication Data
US 2022/0283917 A1 Sep. 8, 2022

(30) Foreign Application Priority Data
Mar. 2, 2021 (KR) .................. 10-2021-0027773

(51) Int. Cl.
| G11C 29/00 | (2006.01) |
| G06F 9/4401 | (2018.01) |
| G11C 29/14 | (2006.01) |
| G11C 29/04 | (2006.01) |

(52) U.S. Cl.
CPC .......... *G11C 29/789* (2013.01); *G06F 9/4403* (2013.01); *G11C 29/04* (2013.01); *G11C 29/14* (2013.01); *G11C 29/702* (2013.01); *G11C 2229/763* (2013.01)

(58) Field of Classification Search
None
See application file for complete search history.

(56) References Cited

U.S. PATENT DOCUMENTS 9,870,837 B1 * 1/2018 Shim .................. G11C 29/787

FOREIGN PATENT DOCUMENTS

| KR | 1020140124545 A | 10/2014 |
| KR | 20180009204 A * | 7/2016 |
| KR | 101937232 B1 | 1/2019 |

* cited by examiner

*Primary Examiner* — Guerrier Merant
(74) *Attorney, Agent, or Firm* — William Park & Associates Ltd.

(57) ABSTRACT

An apparatus includes a boot-up control circuit configured to, when a first boot-up operation is performed, latch first fuse data by receiving the first fuse data and fuse information from a fuse circuit and configured to, when a second boot-up operation is performed, latch second fuse data by receiving the second fuse data from the fuse circuit based on the fuse information; and a rupture control circuit configured to store a failure address as the second fuse data by rupturing the fuse circuit based on the fuse information.

19 Claims, 6 Drawing Sheets

APPARATUS PERFORMING REPAIR OPERATION

CROSS-REFERENCE TO RELATED APPLICATION

The present application claims priority under 35 U.S.C. § 119(a) to Korean Patent Application No. 10-2021-0027773 filed on Mar. 2, 2021 in the Korean Intellectual Property Office, which is incorporated herein by reference in its entirety.

BACKGROUND

1. Technical Field

Embodiments of the disclosure may generally relate to an apparatus performing a repair operation.

2. Related Art

A semiconductor device may perform a repair operation of replacing a failed memory cell with a normal memory cell. The repair operation is performed as an address of a failed memory cell is stored in the device. The semiconductor device may perform the repair operation not only in a wafer state but also in a package state, using a post package repair (PPR) mode.

SUMMARY

In an embodiment, an apparatus may include: a boot-up control circuit configured to, when a first boot-up operation is performed, latch first fuse data by receiving the first fuse data and fuse information from a fuse circuit and configured to, when a second boot-up operation is performed, latch second fuse data by receiving the second fuse data from the fuse circuit based on the fuse information; and a rupture control circuit configured to store a failure address as the second fuse data by rupturing the fuse circuit based on the fuse information.

In an embodiment, an apparatus may include: a boot-up control circuit configured to generate first and second boot-up signals in a repair mode and configured to latch fuse data by receiving the fuse data based on the first and second boot-up signals; and a fuse circuit configured to output the fuse data that is stored in a plurality of fuse regions based on the first boot-up signal, and configured to output the fuse data that is stored in one among the plurality of fuse regions, based on the second boot-up signal.

DETAILED DESCRIPTION

In the description of the following embodiments, the terms "preset" and "predetermined" mean that the numerical value of a parameter is determined in advance when the parameter is used in a process or algorithm. Depending on the embodiment, the numerical value of a parameter may be set when a process or algorithm starts or may be set during a period in which the process or algorithm is executed.

Terms such as "first" and "second" used to distinguish various components are not limited by components. For example, a first component may be named a second component, and conversely, the second component may be named the first component.

When it is described that one component is "coupled" or "connected" to another component, it is to be understood that the one component may be coupled or connected to the another component directly or by the medium of still another component. On the other hand, the descriptions of "directly coupled" or "directly connected" should be understood to mean that one component is coupled or connected to another component directly without intervention of a still another component.

"Logic high level" and "logic low level" are used to describe logic levels of signals. A signal with a "logic high level" is distinguished from a signal with a "logic low level." For example, when a signal with a first voltage corresponds to a signal with a "logic high level," a signal with a second voltage may correspond to a signal with a "logic low level." Depending on the embodiment, a "logic high level" may be set to a voltage higher than a "logic low level." Meanwhile, depending on the embodiment, logic levels of signals may be set to different logic levels or opposite logic levels. For example, depending on the embodiment, a signal with a logic high level may be set to have a logic low level, and a signal with a logic low level may be set to have a logic high level.

Hereinafter, various examples of embodiments of the disclosure will be described in detail with reference to the accompanying drawings. These embodiments are only for illustrating the disclosure, and the scope of protection of the disclosure is not limited by these embodiments.

Various embodiments are directed to an apparatus performing a repair operation.

According to the disclosure, when a repair mode for updating a failure address, applied from outside of an apparatus, to an internal circuit is performed, failure addresses that are previously stored in the apparatus may be updated in advance, and then, only a failure address that is applied from the outside may be separately updated, whereby it is possible to stably perform an internal operation even during a period in which the repair mode progresses.

Figure 1:
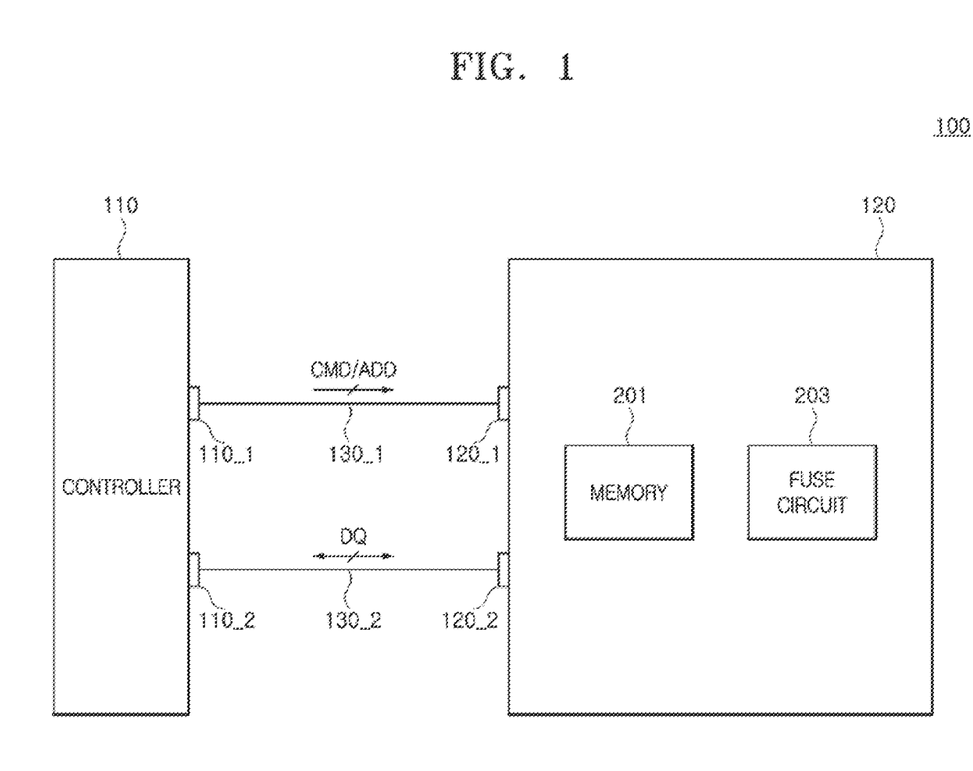
FIG. 1 is a block diagram illustrating a configuration of a system in accordance with an embodiment of the disclosure.

FIG. 1 is a block diagram illustrating a configuration of a system 100 in accordance with an embodiment of the disclosure. As illustrated in FIG. 1, the system 100 may include a controller (CONTROLLER) 110 and an apparatus 120. The apparatus 120 may be implemented by a semiconductor device.

The controller 110 may include a first control pin 110_1 and a second control pin 110_2. The apparatus 120 may include a first apparatus pin 120_1 and a second apparatus pin 120_2. The controller 110 may transmit an external command CMD and an external address ADD to the apparatus 120 through a first transmission line 130_1 that is coupled between the first control pin 110_1 and the first apparatus pin 120_1. According to an embodiment, the controller 110 may transmit the external command CMD and the external address ADD to the apparatus 120 through different transmission lines, respectively. The number of bits of the external command CMD may be varied based on the embodiment. The number of bits of the external address ADD may be varied based on the embodiment. The controller 110 may transmit data DQ to the apparatus 120 through a second transmission line 130_2 that is coupled between the second control pin 110_2 and the second apparatus pin 120_2. The number of bits of the data DQ may be varied based on the embodiment.

The apparatus 120 may include a memory (MEMORY) 201 and a fuse circuit (FUSE CIRCUIT) 203. The memory 201 may include a plurality of memory regions 201_1 to 201_L (see FIG. 2), which store data DQ. 'L' may be set to a natural number that is equal to or greater than 2. The fuse circuit 203 may include a plurality of fuse regions 203_1 to 203_N (see FIG. 2) that store fuse data FZD (see FIG. 2) and fuse information FZ_EN (see FIG. 2). 'N' may be set to a natural number that is equal to or greater than 2.

The apparatus 120 may perform various internal operations, such as a repair mode, a test mode, a row operation, and a column operation by receiving the external command CMD, the external address ADD, and the data DQ from the controller 110.

The apparatus 120 may perform the test mode by receiving the external command CMD with a combination for performing the test mode. When performing the test mode, the apparatus 120 may store addresses of the memory regions in which failures have occurred, as the fuse data FZD (see FIG. 2), in first to M^th fuse regions 203_1 to 203_M. In the test mode, a memory region in which a failure has occurred may be set as at least one region, among the plurality of memory regions 201_1 to 201_L (see FIG. 2). 'M' may be set to a natural number equal to or less than 'N.'

The apparatus 120 may generate an internal command ICMD (see FIG. 2) for performing a predetermined operation based on the received external command CMD with a combination for performing the predetermined operation. When performing the predetermined operation, the apparatus 120 may generate an internal address IADD (see FIG. 2) by receiving the external address ADD. In the present embodiment, the predetermined operation may be set as one of the row operation and the column operation. The row operation may include an active operation. The column operation may include a write operation and a read operation. When the predetermined operation is set as the row operation, the internal address IADD may be set as a row address. When the predetermined operation is set as the column operation, the internal address IADD may be set as a column address.

The apparatus 120 may internally generate a repair command PPR (internal circuit that generates the repair command PPR is not shown) for entering the repair mode based on the received external command CMD with a combination for performing the repair mode. When entering the repair mode, the apparatus 120 may generate a failure address FA (internal circuit that generates the failure address FA is not shown) based on the received external address ADD of a memory region in which a failure has occurred. In the repair mode, a memory region in which a failure has occurred may be set as one region, among the plurality of memory regions 201_1 to 201_L (see FIG. 2). The repair mode may be set as a post package repair (PPR) mode in which, when the apparatus 120 is in a package state, the failure address FA is stored as the fuse data FZD by rupturing an (M+I)^th fuse region 203_M+I (hereinafter, a target fuse region), among the plurality of fuse regions 203_1 to 203_N, and the fuse data FZD that is stored in the target fuse region 203_M+I may be updated to a latch circuit 225 (see FIG. 3). The target fuse region 203_M+I, among the plurality of fuse regions 203_1 to 203_N, may be set as one region in which a rupture operation is not performed before the repair mode is performed. 'I' may be set as the number of times the apparatus 120 enters the repair mode.

By entering the repair mode, the apparatus 120 may sequentially perform a first boot-up operation, a rupture operation, and a second boot-up operation. The rupture operation may be performed after the first boot-up operation is completed. The second boot-up operation may be performed after the rupture operation is completed.

Figure 2:
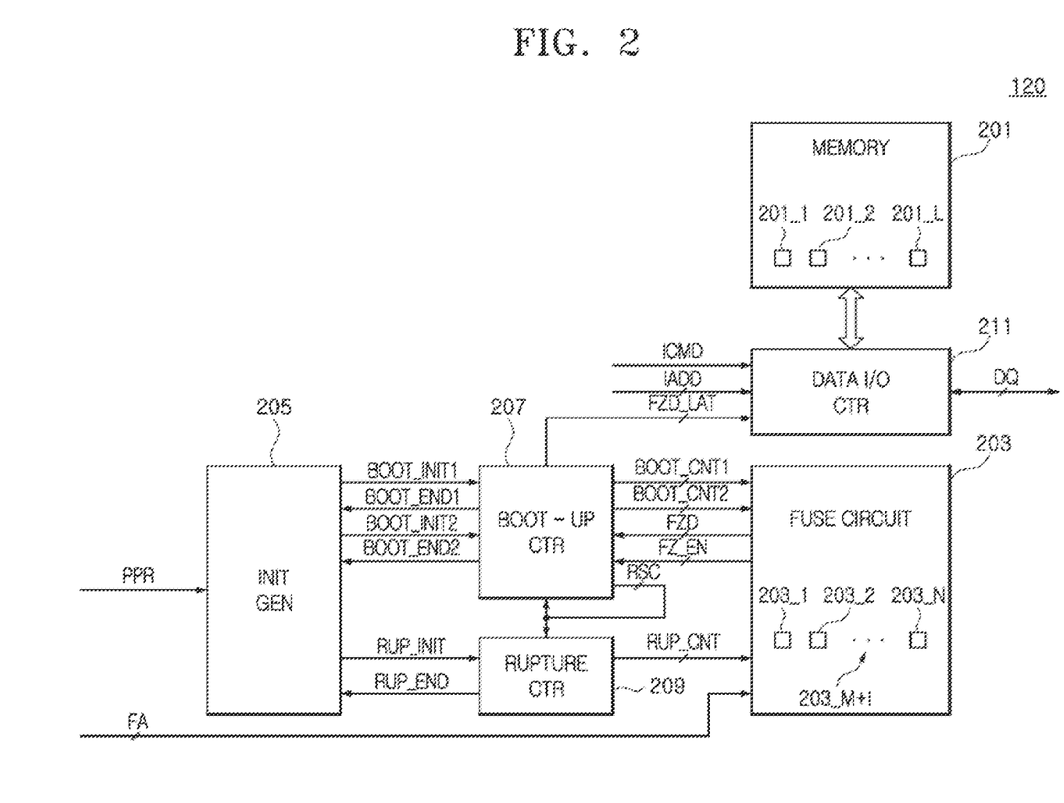
FIG. 2 is a block diagram illustrating a configuration of an embodiment of an apparatus included in the system illustrated in FIG. 1.

When performing the first boot-up operation, the apparatus 120 may generate resource information RSC (see FIG. 2) with information that corresponds to the target fuse region 203_M+I (see FIG. 2), from the fuse information FZ_EN (see FIG. 2) stored in the plurality of fuse regions 203_1 to 203_N (see FIG. 2). In addition, when performing the first boot-up operation, the apparatus 120 may update the fuse data FZD (see FIG. 2), previously stored in the plurality of fuse regions 203_1 to 203_N, to the latch circuit 225 (see FIG. 3). When performing the first boot-up operation, the apparatus 120 may deactivate the internal command ICMD (see FIG. 2) for performing the predetermined operation, during a period in which the fuse data FZD that is stored therein is updated. After the first boot-up operation is ended, the apparatus 120 may activate the internal command ICMD for performing the predetermined operation.

Thereafter, when performing the rupture operation, the apparatus 120 may store the failure address FA (see FIG. 2) as the fuse data FZD (see FIG. 2) by rupturing the target fuse region 203_M+I (see FIG. 2) based on the resource information RSC (see FIG. 2).

Figure 3:
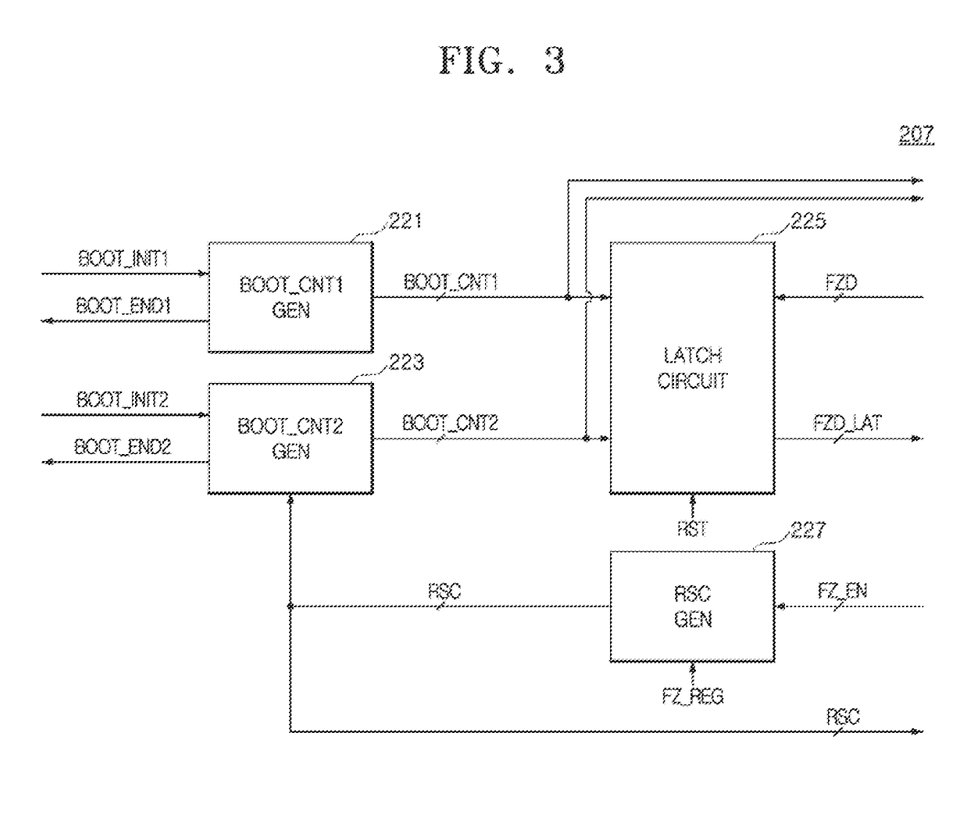
FIG. 3 is a block diagram illustrating a configuration of an embodiment of a boot-up control circuit illustrated in FIG. 2.

Lastly, when performing the second boot-up operation, the apparatus 120 may update the fuse data FZD (see FIG. 2), stored in the target fuse region 203_M+I (see FIG. 2) based on the resource information RSC (see FIG. 2), to the latch circuit 225 (see FIG. 3).

In order to stably perform the predetermined operation during a period in which the repair mode progresses, the apparatus 120 may receive the external address ADD with a combination that is different from a combination of the failure address FA (see FIG. 2).

As a result, when performing the repair mode to update the failure address FA (see FIG. 2), applied from the outside, to the latch circuit 225 (see FIG. 3), the apparatus 120 may update, in advance, the fuse data FZD (see FIG. 2) that was previously stored in the plurality of fuse regions 203_1 to 203_N (see FIG. 2), and then, the apparatus 120 may separately update only the failure address FA (see FIG. 2) that is applied from the outside. Therefore, it is possible to stably perform an internal operation even during the period in which the repair mode progresses.

FIG. 2 is a block diagram illustrating a configuration of an embodiment of the apparatus 120 illustrated in FIG. 1. As illustrated in FIG. 2, the apparatus 120 may include the memory (MEMORY) 201, the fuse circuit (FUSE CIRCUIT) 203, an initiation signal generation circuit (INIT GEN) 205, a boot-up control circuit (BOOT-UP CTR) 207, a rupture control circuit (RUPTURE CTR) 209 and a data input/output control circuit (DATA I/O CTR) 211.

The memory 201 may include the plurality of memory regions 201_1 to 201_L that input and output data DQ. The plurality of memory regions 201_1 to 201_L may include respective word lines that are activated based on the combination of the row address when the row operation is performed. The plurality of memory regions 201_1 to 201_L may include respective bit lines that are activated based on the combination of the column address when the column operation is performed.

The fuse circuit 203 may include the plurality of fuse regions 203_1 to 203_N that store the fuse data FZD and the fuse information FZ_EN. The fuse data FZD may include first to N^th fuse data FZD<1:N>. The fuse information FZ_EN may include first to N^th fuse information FZ_EN<1:N>. The plurality of fuse regions 203_1 to 203_N may store the first to N^th fuse data FZD<1:N> and the first to N^th fuse information FZ_EN<1:N>, respectively. For example, the first fuse region 203_1 may store the first fuse data FZD<1> and the first fuse information FZ_EN<1>. The second fuse region 203_2 may store the second fuse data FZD<2> and the second fuse information FZ_EN<2>.

The fuse data FZD may be set as the address of a memory region in which a failure has occurred in the test mode or the repair mode. The address of a memory region in which a failure has occurred may be set as one of a row address and a column address. The fuse information FZ_EN may include information on whether the rupture operation has been performed in the plurality of fuse regions 203_1 to 203_N. For example, the first fuse region 203_1 may store the first fuse data FZD<1> and the first fuse information FZ_EN<1> in the test mode. The first fuse data FZD<1> may be set as the address of a memory region in which a failure has occurred in the test mode. The first fuse information FZ_EN<1> may include information on whether the rupture operation has been performed in the first fuse region 203_1. The second fuse region 203_2 may store the second fuse data FZD<2> and the second fuse information FZ_EN<2> in the repair mode. The second fuse data FZD<2> may be set as the address of a memory region in which a failure has occurred in the repair mode. The second fuse information FZ_EN<2> may include information on whether the rupture operation has been performed in the second fuse region 203_2.

When the first boot-up operation is performed in the repair mode, the fuse circuit 203 may sequentially output the fuse data FZD that is stored in the plurality of fuse regions 203_1 to 203_N based on a first boot-up signal BOOT_CNT1. When the rupture operation is performed in the repair mode, the fuse circuit 203 may store the failure address FA as (M+I)^th fuse data FZD<M+I> by rupturing the target fuse region 203_M+I, among the plurality of fuse regions 203_1 to 203_N, based on a rupture signal RUP_CNT. When the second boot-up operation is performed in the repair mode, the fuse circuit 203 may output the (M+I)^th fuse data FZD<M+I> that is stored in the target fuse region 203_M+I, among the plurality of fuse regions 203_1 to 203_N, based on a second boot-up signal BOOT_CNT2.

The initiation signal generation circuit 205 may sequentially generate a first boot-up initiation signal BOOT_INIT1, a rupture initiation signal RUP_INIT, and a second boot-up initiation signal BOOT_INIT2 based on the repair command PPR. The repair command PPR may be generated based on the external command CMD (see FIG. 1) with a combination for performing the repair mode. The repair command PPR may be activated to enter the repair mode. The first boot-up initiation signal BOOT_INIT1 may be activated to enter the first boot-up operation in the repair mode. The rupture initiation signal RUP_INIT may be activated to enter the rupture operation in the repair mode. The second boot-up initiation signal BOOT_INIT2 may be activated to enter the second boot-up operation in the repair mode. When the repair command PPR is activated, the initiation signal generation circuit 205 may activate the first boot-up initiation signal BOOT_INIT1. When the first boot-up operation is completed in the repair mode, the initiation signal generation circuit 205 may receive an activated first boot-up end signal BOOT_END1. When the first boot-up end signal BOOT_END1 is activated, the initiation signal generation circuit 205 may activate the rupture initiation signal RUP_INIT. When the rupture operation is completed in the repair mode, the initiation signal generation circuit 205 may receive an activated rupture end signal RUP_END. When the rupture end signal RUP_END is activated, the initiation signal generation circuit 205 may activate the second boot-up initiation signal BOOT_INIT2. When the second boot-up operation is completed in the repair mode, the initiation signal generation circuit 205 may receive an activated second boot-up end signal BOOT_END2.

When the first boot-up operation is entered based on the first boot-up initiation signal BOOT_INIT1, the boot-up control circuit 207 may generate the first boot-up signal BOOT_CNT1 for performing the first boot-up operation. The number of bits of the first boot-up signal BOOT_CNT1 may be varied depending on the embodiment. Combinations of the first boot-up signal BOOT_CNT1 may correspond to the plurality of fuse regions 203_1 to 203_N, respectively. For example, a first combination of the first boot-up signal BOOT_CNT1 may correspond to the first fuse region 203_1. The N^th combination of the first boot-up signal BOOT_CNT1 may correspond to the N^th fuse region 203_N. The boot-up control circuit 207 may count the first boot-up signal BOOT_CNT1 during a period in which the first boot-up operation is performed in the repair mode. During the period in which the first boot-up operation is performed in the repair mode, the boot-up control circuit 207 may sequentially transition the first to N^th combinations of the first boot-up signal BOOT_CNT1 that correspond to the plurality of fuse regions 203_1 to 203_N, respectively.

When the first boot-up operation is performed in the repair mode, the boot-up control circuit 207 may sequentially receive the fuse data FZD and the fuse information FZ_EN from the fuse circuit 203 based on the first boot-up signal BOOT_CNT1. The boot-up control circuit 207 may receive the fuse data FZD and the fuse information FZ_EN that are stored in the plurality of fuse regions 203_1 to 203_N based on the combination of the first boot-up signal BOOT_CNT1. For example, the boot-up control circuit 207 may receive the first fuse data FZD<1> and the first fuse information FZ_EN<1> that are stored in the first fuse region 203_1 based on the first combination of the first boot-up signal BOOT_CNT1. The boot-up control circuit 207 may receive the second fuse data FZD<2> and the second fuse information FZ_EN<2> that are stored in the second fuse region 203_2 based on the second combination of the first boot-up signal BOOT_CNT1.

When the first boot-up operation is performed in the repair mode, the boot-up control circuit 207 may generate latch data FZD_LAT by receiving the fuse data FZD from the fuse circuit 203 based on the first boot-up signal BOOT_CNT1. When the first boot-up operation is performed in the repair mode, the boot-up control circuit 207 may sequentially output the latch data FZD_LAT by latching the fuse data FZD. For example, when the first boot-up operation is performed in the repair mode, the boot-up control circuit 207 may output first latch data FZD_LAT<1> by latching the first fuse data FZD<1>. When the first boot-up operation is performed in the repair mode, the boot-up control circuit 207 may output second latch data FZD_LAT<2> by latching the second fuse data FZD<2>.

The boot-up control circuit 207 may generate the resource information RSC by receiving the fuse information FZ_EN from the fuse circuit 203 based on the first boot-up signal BOOT_CNT1. The boot-up control circuit 207 may generate the resource information RSC by sequentially receiving the first to N^th fuse information FZ_EN<1:N> from the plurality of fuse regions 203_1 to 203_N based on the first boot-up signal BOOT_CNT1. The resource information RSC may be set as information that corresponds to the target fuse region 203_M+I. When the first boot-up operation is completed in the repair mode, the boot-up control circuit 207 may activate the first boot-up end signal BOOT_END1.

The boot-up control circuit 207 may generate the second boot-up signal BOOT_CNT2 based on the second boot-up initiation signal BOOT_INIT2 and the resource information RSC. When the second boot-up operation is performed in the repair mode, the boot-up control circuit 207 may generate the second boot-up signal BOOT_CNT2 with a combination that corresponds to the resource information RSC. The number of bits of the second boot-up signal BOOT_CNT2 may be varied depending on the embodiment. The combination of the second boot-up signal BOOT_CNT2 may correspond to the target fuse region 203_M+I, among the plurality of fuse regions 203_1 to 203_N. The boot-up control circuit 207 may generate (M+I)^th latch data FZD_LAT<M+I> by latching the (M+I)^th fuse data FZD<M+I> that is stored in the target fuse region 203_M+I, among the plurality of fuse regions 203_1 to 203_N, based on the second boot-up signal BOOT_CNT2. When the second boot-up operation is completed in the repair mode, the boot-up control circuit 207 may activate the second boot-up end signal BOOT_END2. A more detailed configuration and operation of the boot-up control circuit 207 will be described later with reference to FIG. 3.

When the rupture operation is performed based on the rupture initiation signal RUP_INIT and the resource information RSC, the rupture control circuit 209 may generate the rupture signal RUP_CNT. The number of bits of the rupture signal RUP_CNT may be varied depending on the embodiment. The combination of the rupture signal RUP_CNT may correspond to the target fuse region 203_M+I, among the plurality of fuse regions 203_1 to 203_N. The rupture control circuit 209 may store the failure address FA as the (M+I)^th fuse data FZD<M+I> by rupturing the target fuse region 203_M+I based on the resource information RSC. When the rupture operation is completed in the repair mode, the rupture control circuit 209 may activate the rupture end signal RUP_END.

The data input/output control circuit 211 may control a path through which data DQ is input to and output from the memory 201, by comparing the internal address IADD with the latch data FZD_LAT, based on the internal command ICMD. The internal command ICMD may be generated from the external command CMD (see FIG. 1) with a combination for performing the predetermined operation. The internal command ICMD may be deactivated during a period in which the first boot-up operation is performed in the repair mode. The internal command ICMD may be activated after the first boot-up operation is ended in the repair mode. When the predetermined operation is performed, the internal address IADD may be generated from the external address ADD (see FIG. 1). During a period in which the repair mode is performed, the internal address IADD may be generated from the external address ADD (see FIG. 1) with a combination that is different from a combination of the failure address FA. When the predetermined operation is performed, the data input/output control circuit 211 may control a path through which data DQ is input to and output from the plurality of memory regions 201_1 to 201_L, by comparing the internal address IADD with the latch data FZD_LAT. For example, when a combination of the internal address IADD is the same as a combination of the latch data FZD_LAT in the predetermined operation, the data input/output control circuit 211 may change a path through which data DQ is input and output, from a memory region in which a failure has occurred to a normal memory region.

FIG. 3 is a block diagram illustrating a configuration of an embodiment of the boot-up control circuit 207 illustrated in FIG. 2. As illustrated in FIG. 3, the boot-up control circuit 207 may include a first boot-up signal generation circuit (BOOT_CNT1 GEN) 221, a second boot-up signal generation circuit (BOOT_CNT2 GEN) 223, the latch circuit (LATCH CIRCUIT) 225 and a resource information generation circuit (RSC GEN) 227.

The first boot-up signal generation circuit 221 may generate the first boot-up signal BOOT_CNT1 and the first boot-up end signal BOOT_END1 based on the first boot-up initiation signal BOOT_INIT1. The first boot-up signal generation circuit 221 may count the first boot-up signal BOOT_CNT1 during a period in which the first boot-up operation is performed in the repair mode. During the period in which the first boot-up operation is performed in the repair mode, the first boot-up signal generation circuit 221 may sequentially transition the first to N^th combinations of the first boot-up signal BOOT_CNT1 that correspond to the plurality of fuse regions 203_1 to 203_N (see FIG. 2), respectively. The first boot-up signal generation circuit 221 may activate the first boot-up end signal BOOT_END1 after counting the first boot-up signal BOOT_CNT1.

The second boot-up signal generation circuit 223 may generate the second boot-up signal BOOT_CNT2 and the second boot-up end signal BOOT_END2 based on the second boot-up initiation signal BOOT_INT2 and the resource information RSC. The second boot-up signal generation circuit 223 may count the second boot-up signal BOOT_CNT2 that corresponds to the resource information RSC during a period in which the second boot-up operation is performed in the repair mode. The second boot-up signal generation circuit 223 may activate the second boot-up end signal BOOT_END2 after counting the second boot-up signal BOOT_CNT2.

The latch circuit 225 may generate the latch data FZD_LAT by latching the fuse data FZD based on the first boot-up signal BOOT_CNT1 and the second boot-up signal BOOT_CNT2. When the first boot-up operation is entered, based on a reset signal RST, the latch circuit 225 may initialize all the latch data FZD_LAT to a logic low level or a logic high level. The reset signal RST may be activated to perform an initialization operation when the first boot-up operation is entered. When the first boot-up operation is performed, the latch circuit 225 may receive the fuse data FZD depending on a combination of the first boot-up signal BOOT_CNT1. When the first boot-up operation is performed, the latch circuit 225 may generate the latch data FZD_LAT by latching the fuse data FZD that is received based on the first boot-up signal BOOT_CNT1. When the second boot-up operation is performed, the latch circuit 225 may receive the fuse data FZD based on the combination of the second boot-up signal BOOT_CNT2. When the second boot-up operation is performed, the latch circuit 225 may generate the latch data FZD_LAT by latching the fuse data FZD that is received based on the second boot-up signal BOOT_CNT2.

The resource information generation circuit 227 may generate the resource information RSC based on a fuse region signal FZ_REG and the fuse information FZ_EN. The fuse region signal FZ_REG may include information on a fuse bank region (not illustrated), among the plurality of fuse regions 203_1 to 203_N (see FIG. 2), when the first boot-up operation is performed. For example, a first fuse bank region may be set as a part of the plurality of fuse regions 203_1 to 203_N (see FIG. 2), and a second fuse bank region may be set as the other part of the plurality of fuse regions 203_1 to 203_N (see FIG. 2). The resource information generation circuit 227 may generate the resource information RSC that corresponds to the target fuse region 203_M+I (see FIG. 2) by detecting information that is included in the fuse region signal FZ_REG and the fuse information FZ_EN.

Figure 4:
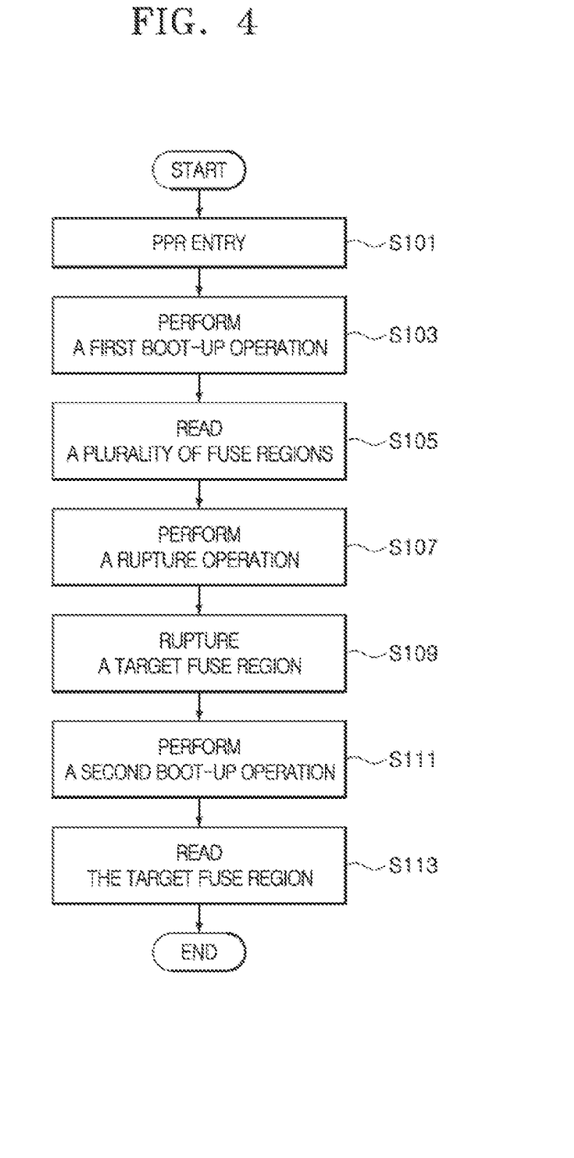
FIG. 4 is a flow chart to assist in the explanation of a repair mode performed in the apparatus illustrated in FIG. 2.

FIG. 4 is a flow chart to assist in the explanation of the repair mode performed in the apparatus 120 illustrated in FIG. 2.

At step S101, the apparatus 120 may generate the repair command PPR for entering the repair mode, by receiving, from the controller 110 (see FIG. 1), the external command CMD (see FIG. 1) for performing the repair mode. When entering the repair mode, the apparatus 120 may generate the failure address FA by receiving, from the controller 110 (see FIG. 1), the external address ADD (see FIG. 1) of a memory region in which a failure has occurred.

At step S103, the initiation signal generation circuit 205 may generate the first boot-up initiation signal BOOT_INIT1 for entering the first boot-up operation based on the repair command PPR.

At step S105, when the first boot-up operation is entered, the boot-up control circuit 207 may initialize the latch data FZD_LAT. The boot-up control circuit 207 may generate the first boot-up signal BOOT_CNT1 for performing the first boot-up operation, based on the first boot-up initiation signal BOOT_INIT1. The fuse circuit 203 may output the fuse data FZD and the fuse information FZ_EN that are stored in the plurality of fuse regions 203_1 to 203_N, based on the first boot-up signal BOOT_CNT1. The boot-up control circuit 207 may generate the latch data FZD_LAT by latching the fuse data FZD based on the first boot-up signal BOOT_CNT1. The boot-up control circuit 207 may generate the resource information RSC from the fuse information FZ_EN based on the first boot-up signal BOOT_CNT1. When the first boot-up operation is completed, the boot-up control circuit 207 may generate the first boot-up end signal BOOT_END1.

At step S107, the initiation signal generation circuit 205 may generate the rupture initiation signal RUP_INIT for entering the rupture operation based on the first boot-up end signal BOOT_END1.

At step S109, the rupture control circuit 20 may generate the rupture signal RUP_CNT that corresponds to the resource information RSC based on the rupture initiation signal RUP_INIT. The fuse circuit 203 may store the failure address FA as the fuse data FZD by rupturing the target fuse region 203_M+I, among the plurality of fuse regions 203_1 to 203_N, based on the rupture signal RUP_CNT. When the rupture operation is completed, the rupture control circuit 205 may generate the rupture end signal RUP_END.

At step S111, the initiation signal generation circuit 205 may generate the second boot-up initiation signal BOOT_INIT2 for entering the second boot-up operation, based on the rupture end signal RUP_END.

At step S113, the boot-up control circuit 207 may generate the second boot-up control signal BOOT_CNT2 that corresponds to the resource information RSC based on the second boot-up initiation signal BOOT_INIT2. The fuse circuit 203 may output the fuse data FZD that is stored in the target fuse region 203_M+I, among the plurality of fuse regions 203_1 to 203_N based on the second boot-up signal BOOT_CNT2. The boot-up control circuit 207 may generate the latch data FZD_LAT by latching the fuse data FZD based on the second boot-up signal BOOT_CNT2. When the second boot-up operation is completed, the boot-up control circuit 207 may generate the second boot-up end signal BOOT_END2.

Figure 5:
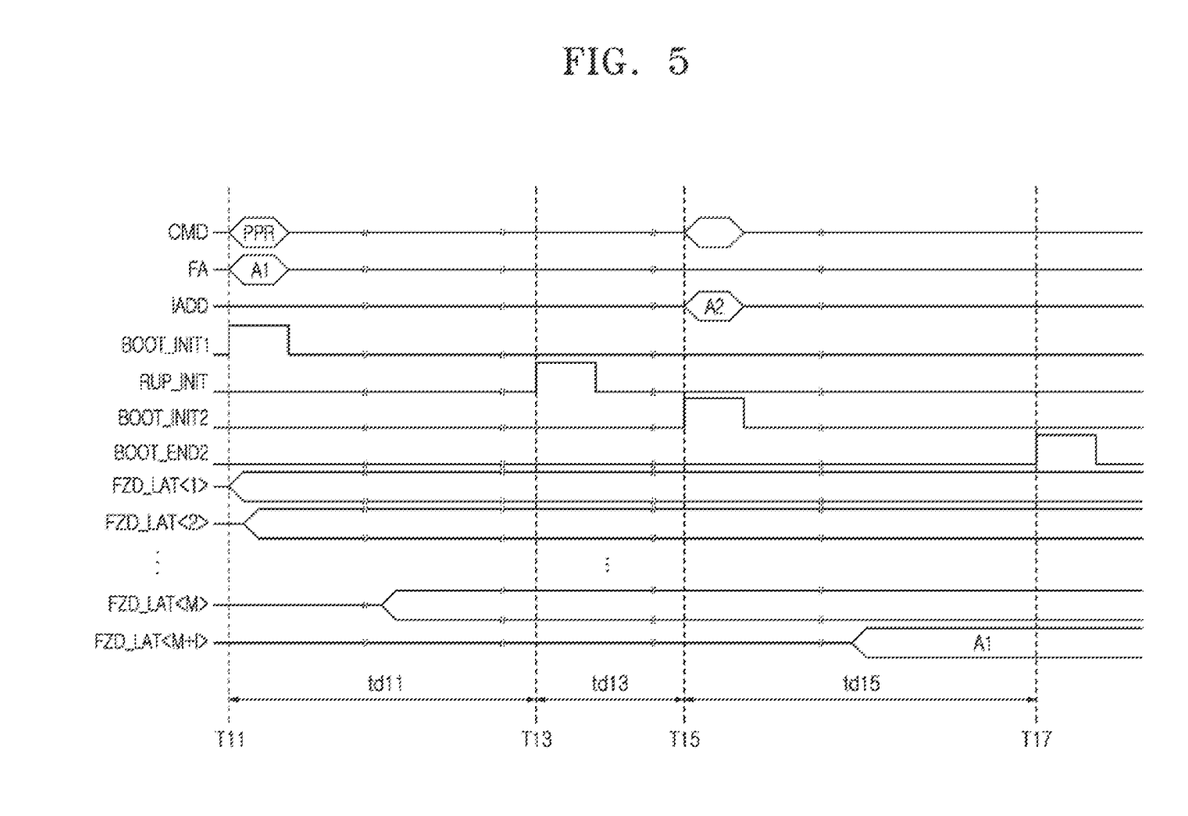
FIG. 5 is a timing diagram to assist in the explanation of a predetermined operation performed when the repair mode progresses in the apparatus illustrated in FIG. 2.

FIG. 5 is a timing diagram to assist in the explanation of the predetermined operation performed when the repair mode progresses in the apparatus 120 illustrated in FIG. 2.

At a time point T11, the apparatus 120 may generate the repair command PPR for entering the repair mode, by receiving, from the controller 110 (see FIG. 1), the external command CMD (see FIG. 1) for performing the repair mode. The apparatus 120 may generate the failure address FA with a combination 'A1' by receiving the external address ADD (see FIG. 1) from the controller 110 (see FIG. 1). The initiation signal generation circuit 205 may generate the first boot-up initiation signal BOOT_INIT1 for entering the first boot-up operation based on the repair command PPR. The boot-up control circuit 207 may sequentially receive first to M^th fuse data FZD<1:M> from the fuse circuit 203 during a period td11 in which the first boot-up operation is performed. The boot-up control circuit 207 may sequentially generate first to M^th latch data FZD_LAT<1:M> by latching the first to M^th fuse data FZD<1:M> during the period td11 in which the first boot-up operation is performed.

At a time point T13, the boot-up control circuit 207 may generate the first boot-up end signal BOOT_END1. The initiation signal generation circuit 205 may generate the rupture initiation signal RUP_INIT for entering the rupture operation based on the first boot-up end signal BOOT_END1. The rupture control circuit 209 may store the failure address FA with the logic level combination 'A1' as the (M+I)^th fuse data FZD<M+I> by rupturing the target fuse region 203_M+I during a period td13 in which the rupture operation is performed.

At a time point T15, the rupture control circuit 209 may generate the rupture end signal RUP_END. The initiation signal generation circuit 205 may generate the second boot-up initiation signal BOOT_INIT2 based on the rupture end signal RUP_END. During a period td15 in which the second boot-up operation is performed, the boot-up control circuit 207 may receive the (M+I)^th fuse data FZD<M+I> that is stored in the target fuse region 203_M+I. During the period td15 in which the second boot-up operation is performed, the boot-up control circuit 207 may generate the (M+I)^th latch data FZD_LAT<M+I> by latching the (M+I)^th fuse data FZD<M+I>. When the predetermined operation is performed, the data input/output control circuit 211 may compare the internal address IADD with a combination 'A2' with the latch data FZD_LAT.

At a time point T17, when the repair mode is completed, the initiation signal generation circuit 205 may generate the second boot-up end signal BOOT_END2.

As is apparent from the above description, in the disclosure, when a repair mode for updating a failure address, applied from the outside of an apparatus, to an internal circuit is performed, failure addresses that were previously stored in the apparatus may be updated in advance, and then, only a failure address applied from the outside may be separately updated, whereby it is possible to stably perform an internal operation even during a period in which the repair mode progresses.

Figure 6:
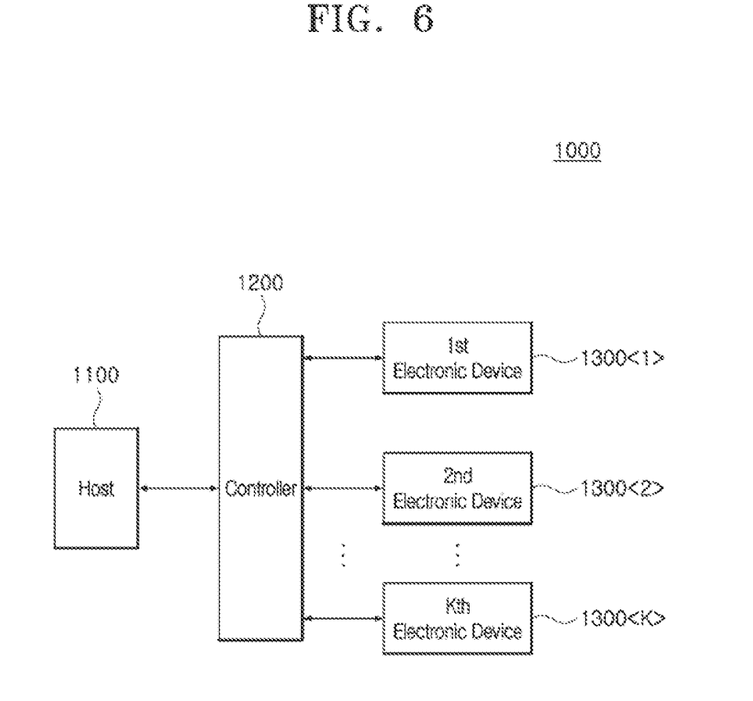
FIG. 6 is a block diagram illustrating a configuration of another embodiment of the system illustrated in FIG. 1.

FIG. 6 is a block diagram illustrating a configuration of another embodiment of the system 100 illustrated in FIG. 1. As illustrated in FIG. 6, a system 1000 may include a host 1100, a controller 1200 and electronic devices 1300<1:K>. The controller 1200 may be implemented by the controller 110 illustrated in FIG. 1. Each of the electronic devices 1300<1:K> may be implemented by the apparatus 120 illustrated in FIG. 1.

The host 1100 and the controller 1200 may transmit signals to each other by using an interface protocol. Examples of the interface protocol used between the host 1100 and the controller 1200 may include MMC (multimedia card), ESDI (enhanced small disk interface), IDE (integrated drive electronics), PCI-E (peripheral component interconnect-express), ATA (advanced technology attachment), SATA (serial ATA), PATA (parallel ATA), SAS (serial attached SCSI) and USB (universal serial bus).

The controller 1200 may control the electronic devices 1300<1:K> so that each of the electronic devices 1300<1:K> performs various internal operations including a repair mode, a test mode, a row operation and a column operation.

According to an embodiment, the electronic devices 1300<1:K> may be implemented with a DRAM (dynamic random access memory), a PRAM (phase change random access memory), an RRAM (resistive random access memory), an MRAM (magnetic random access memory) and an FRAM (ferroelectric random access memory).

While various embodiments have been described above, it will be understood to those skilled in the art that the embodiments described are by way of example only. Accordingly, the apparatus performing a repair operation described herein should not be limited based on the described embodiments.

What is claimed is:

1. An apparatus comprising:
a boot-up control circuit configured to, when a first boot-up operation is performed, latch first fuse data by receiving the first fuse data and fuse information from a fuse circuit and configured to, when a second boot-up operation is performed, latch second fuse data by receiving the second fuse data from the fuse circuit based on the fuse information;
a rupture control circuit configured to store a failure address as the second fuse data by rupturing the fuse circuit based on the fuse information; and
a data input/output control circuit configured to control a path through which data is input to and output from a memory, by comparing an internal address with first latch data when a predetermined operation is performed,
wherein an internal command for the predetermined operation is deactivated during a period in which the first boot-up operation is performed in a repair mode.

2. The apparatus according to claim 1, wherein the fuse circuit comprises:
a plurality of fuse regions including a first fuse region and a second fuse region,
wherein the first fuse region is configured to store the first fuse data and first fuse information,
wherein the second fuse region is configured to store the second fuse data and second fuse information, and
wherein the fuse information includes the first and second fuse information.

3. The apparatus according to claim 2,
wherein the first fuse region is configured to store the first fuse data and the first fuse information when a test mode is performed,
wherein the first fuse data is stored as an address of a memory region in which a failure has occurred when the test mode is performed, and
wherein the first fuse information includes information on whether a rupture operation has been performed in the first fuse region.

4. The apparatus according to claim 2,
wherein the second fuse region is configured to store the second fuse data and the second fuse information when the repair mode is performed,
wherein the second fuse data is stored as the failure address applied from an outside of the apparatus when the repair mode is performed, and
wherein the second fuse information includes information on whether a rupture operation has been performed in the second fuse region.

5. The apparatus according to claim 2,
wherein, when the first boot-up operation is performed in the repair mode, the boot-up control circuit receives the first fuse data and outputs the first latch data by latching the first fuse data.

6. The apparatus according to claim 2,
wherein the boot-up control circuit is configured to generate resource information by receiving the first and second fuse information when the first boot-up operation is performed in the repair mode, and
wherein the resource information is set as information that corresponds to the second fuse region.

7. The apparatus according to claim 6,
wherein the rupture control circuit is configured to store the failure address as the second fuse data by rupturing the second fuse region based on the resource information when a rupture operation is performed in the repair mode, and
wherein the rupture operation is performed after the first boot-up operation is completed.

8. The apparatus according to claim 7,
wherein the boot-up control circuit is configured to receive the second fuse data that is stored in the second fuse region based on the resource information when the second boot-up operation is performed in the repair mode and configured to output second latch data by latching the second fuse data, and
wherein the second boot-up operation is performed after the rupture operation is completed.

9. The apparatus according to claim 8, further comprising:
wherein the data input/output control circuit configured to control the path through which data is input to and output from the memory, by comparing the internal address to the second latch data when the predetermined operation is performed in the repair mode,
wherein the internal address is generated from an external address with a combination that is different from a combination of the failure address during a period in which the repair mode is performed.

10. An apparatus comprising:
a boot-up control circuit configured to generate first and second boot-up signals in a repair mode and configured to latch fuse data by receiving the fuse data based on the first and second boot-up signals; and a fuse circuit configured to output the fuse data that is stored in a plurality of fuse regions based on the first boot-up signal and configured to output the fuse data that is stored in one, among the plurality of fuse regions, based on the second boot-up signal; and a data input/output control circuit configured to control a path through which data is input to and output from a memory, by comparing an internal address with latch data when a predetermined operation is performed, wherein an internal command for the predetermined operation is deactivated during a period in which the first boot-up operation is performed in the repair mode.

11. The apparatus according to claim 10,
wherein the boot-up control circuit sequentially transitions combinations of the first boot-up signal when a first boot-up operation is performed in the repair mode, and
wherein the combinations of the first boot-up signal correspond to the plurality of fuse regions, respectively.

12. The apparatus according to claim 11,
wherein, when the first boot-up operation is performed in the repair mode, the fuse circuit is configured to output the fuse data that is stored in the plurality of fuse regions based on the combinations of the first boot-up signal.

13. The apparatus according to claim 10,
wherein, when the first boot-up operation is performed in the repair mode, the boot-up control circuit is configured to sequentially generate the latch data by latching the fuse data that is output from the plurality of fuse regions based on the first boot-up signal.

14. The apparatus according to claim 13,
wherein the boot-up control circuit is configured to initialize the latch data when the first boot-up operation is entered in the repair mode.

15. The apparatus according to claim 10,
wherein the boot-up control circuit is configured to generate the second boot-up signal when a second boot-up operation is performed in the repair mode, and
wherein the second boot-up signal has a combination corresponding to the one among the plurality of fuse regions.

16. The apparatus according to claim 15,
wherein, when the second boot-up operation is performed in the repair mode, the fuse circuit is configured to output the fuse data that is stored in the one among the plurality of fuse regions based on the combination of the second boot-up signal.

17. The apparatus according to claim 10,
wherein, when the second boot-up operation is performed in the repair mode, the boot-up control circuit is configured to generate the latch data by latching the fuse data that is output from the one among the plurality of fuse regions based on the second boot-up signal.

18. The apparatus according to claim 10,
wherein, when the first boot-up operation is performed in the repair mode, the boot-up control circuit is configured to generate resource information by receiving fuse information that is stored in the plurality of fuse regions based on the first boot-up signal, and
wherein the fuse information includes information on whether a rupture operation has been performed in the plurality of fuse regions.

19. The apparatus according to claim 18,
wherein the boot-up control circuit is configured to generate the second boot-up signal based on the resource information when the second boot-up operation is performed in the repair mode.

* * * * *